(12) United States Patent
Ma et al.

(10) Patent No.: US 9,679,870 B2
(45) Date of Patent: Jun. 13, 2017

(54) INTEGRATED CIRCUIT DEVICE WITH SHAPED LEADS AND METHOD OF FORMING THE DEVICE

(71) Applicant: STMICROELECTRONICS PTE LTD, Singapore (SG)

(72) Inventors: Yiyi Ma, Singapore (SG); Kim-Yong Goh, Singapore (SG); Xueren Zhang, Singapore (SG); Wei Zhen Goh, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 194 days.

(21) Appl. No.: 14/565,484

(22) Filed: Dec. 10, 2014

(65) Prior Publication Data

US 2016/0172262 A1    Jun. 16, 2016

(51) Int. Cl.
*H01L 23/00* (2006.01)
*H01L 23/482* (2006.01)
*H01L 23/495* (2006.01)
*H01L 23/31* (2006.01)

(52) U.S. Cl.
CPC .......... *H01L 24/85* (2013.01); *H01L 23/3107* (2013.01); *H01L 23/4822* (2013.01); *H01L 23/49555* (2013.01); *H01L 24/49* (2013.01); *H01L 2224/48177* (2013.01); *H01L 2924/00014* (2013.01); *H01L 2924/14* (2013.01); *H01L 2924/181* (2013.01)

(58) Field of Classification Search
CPC . H01L 24/85; H01L 23/3107; H01L 23/4822; H01L 23/49555; H01L 24/49
See application file for complete search history.

(56) References Cited

U.S. PATENT DOCUMENTS

| | | | |
|---|---|---|---|
| 5,078,186 A | 1/1992 | Togashi et al. | |
| 5,294,039 A | 3/1994 | Pai et al. | |
| 5,347,215 A | 9/1994 | Armstrong et al. | |
| 6,078,099 A | 6/2000 | Liu et al. | |
| 6,261,865 B1 * | 7/2001 | Akram | H01L 23/4951 257/E21.705 |
| 6,661,087 B2 | 12/2003 | Wu | |
| 7,576,437 B2 | 8/2009 | Han et al. | |
| 2007/0029650 A1 * | 2/2007 | Lim | H01L 23/49555 257/666 |
| 2013/0020695 A1 | 1/2013 | Na et al. | |
| 2016/0027721 A1 * | 1/2016 | Lee | H01L 23/49541 174/261 |

* cited by examiner

*Primary Examiner* — Errol Fernandes
(74) *Attorney, Agent, or Firm* — Slater Matsil, LLP

(57) ABSTRACT

An integrated circuit (IC) device includes an IC and encapsulating material surrounding the IC. Leads are coupled to the IC and extend outwardly from sides of the encapsulating material, with each lead having three contiguous exposed segments with upper and lower bends defining a Z-shape. In another example, the leads include an upper horizontal segment, lower horizontal segment, and intermediate curved segment extending upwardly from the upper horizontal segment and downwardly to the lower horizontal segment.

10 Claims, 6 Drawing Sheets

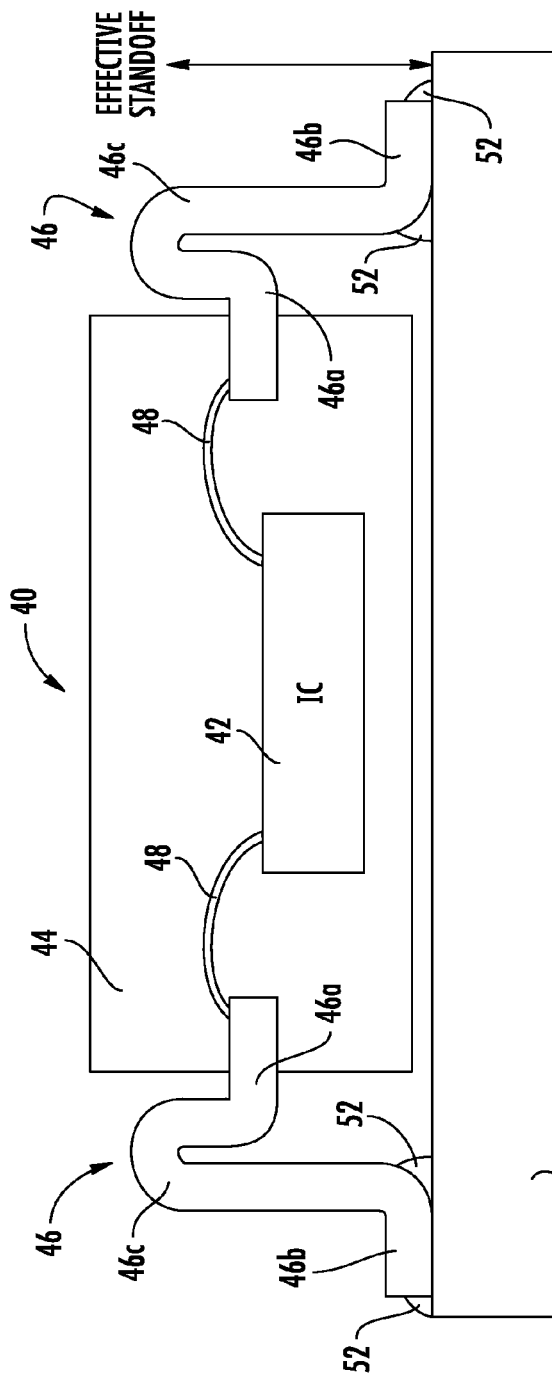
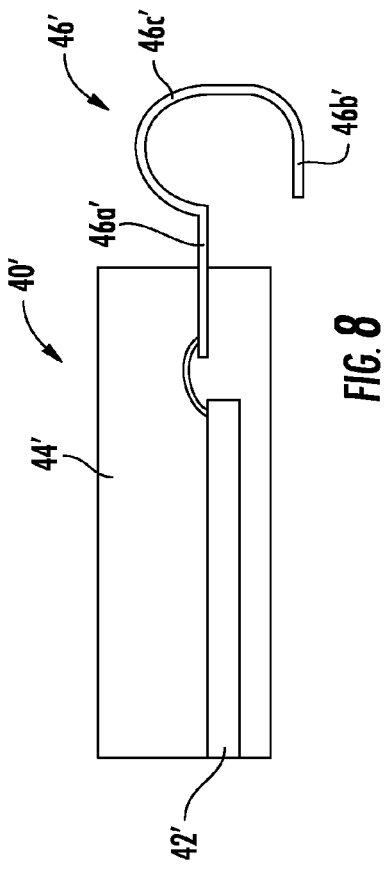
FIG. 7
FIG. 8

US 9,679,870 B2

INTEGRATED CIRCUIT DEVICE WITH SHAPED LEADS AND METHOD OF FORMING THE DEVICE

FIELD OF THE INVENTION

The present invention relates to the field of integrated circuit devices, and more particularly, to surface mounted integrated circuit packages with leads extending from the sides of the package.

BACKGROUND OF THE INVENTION

Surface mounted integrated circuit packages, such as a quad flat package (QFP), include an integrated circuit and encapsulating material surrounding the integrated circuit. A plurality of pins, often called leads, such as "gull wing" leads, usually extend from the four sides of the encapsulating material forming the package. These types of integrated circuit devices are surface mounted devices. Socketing is rare and through-hole mounting is usually not possible. The number of pins vary from as low as 30 to as many as over 300 pins along the package periphery and the pitch ranges from 0.4 to 1.0 mm in some examples. The package form may be a flat rectangular body and often is a square body with leads extending along all four sides. There are numerous design variations, which differ usually in the number of leads, their pitch, the package dimensions, and the materials used to construct the package. Materials often are selected to improve or vary the thermal characteristics of the package. Specific design examples include a thin quad flat package and low profile quad flat package.

Some of the quad flat packages, such as a thin quad flat package, may have a poor board level reliability because its leads are not compliant to bending, which has an adverse effect on a drop test and thermal cycling performance for the package. This may also lead to poor circuit board level solder joint reliability between the leads and the circuit board.

SUMMARY OF THE INVENTION

An integrated circuit (IC) device includes an IC and encapsulating material surrounding the IC. A plurality of leads are coupled to the IC and extend outwardly from sides of the encapsulating material, with each lead having three contiguous exposed segments with upper and lower bends defining a Z-shape.

The Z-shape provides a more flexible lead that connects the device to the board could absorb the deformation mismatch between the device and circuit board during thermal cycling, and thus enhances the solder joint reliability. This becomes more important in automotive designs where higher circuit board level reliability is desired for these types of integrated circuit packages that may absorb the deformation mismatch between the package and the circuit board during thermal cycling where higher heat and stress is imparted.

In an example, the encapsulating material defines a bottom surface. Each lead extends downwardly so that a lowermost surface thereof is below the bottom surface of the encapsulating material. The three contiguous segments are formed in an example as an upper horizontal segment, an intermediate inclined segment, and a lower horizontal segment. The horizontal segment of each lead may extend horizontally outwardly beyond the upper bend and the lower bend of each lead may be horizontally spaced outwardly from the encapsulating material. The intermediate inclined segment of each lead may be inclined at an angle in a range of 40-50 degrees. A respective bond wire may couple each lead to the IC, and the leads may be arranged to define a quad flat package (QFP). In another embodiment, the lower horizontal segment extends horizontally inward toward the encapsulating material.

A method of making an integrated circuit (IC) device includes the steps of surrounding an integrated circuit with an encapsulating material and coupling a plurality of leads to the integrated circuit. The method further includes forming the leads to extend outwardly from sides of the encapsulating material, each lead being formed to have three contiguous exposed segments with upper and lower bends defining a Z-shape.

In another embodiment, the method includes forming the leads to extend horizontally outwardly from the sides of the encapsulating material with each lead having the three contiguous segments comprising an upper horizontal segment, a lower horizontal segment, and an intermediate curved segment extending upwardly from the upper horizontal segment and downwardly to the lower horizontal segment.

BRIEF DESCRIPTION OF THE DRAWINGS

FIG. 7 is a fragmentary, sectional view of another embodiment of the integrated circuit device in accordance with a non-limiting example and showing an intermediate curved segment.

FIG. 8 is another embodiment of the integrated circuit device in accordance with a non-limiting example similar to that shown in FIG. 7 and showing another embodiment of the intermediate curved segment.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
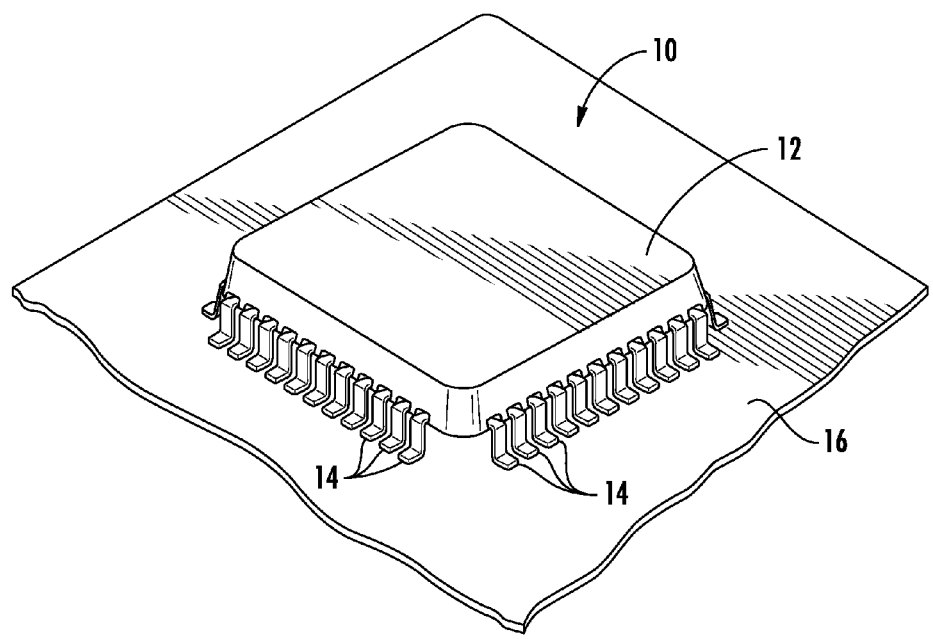
FIG. 1 is perspective view of a prior art integrated circuit device formed as a surface mount integrated circuit package with "gull wing" type leads extending from each of the four sides.
Figure 2:
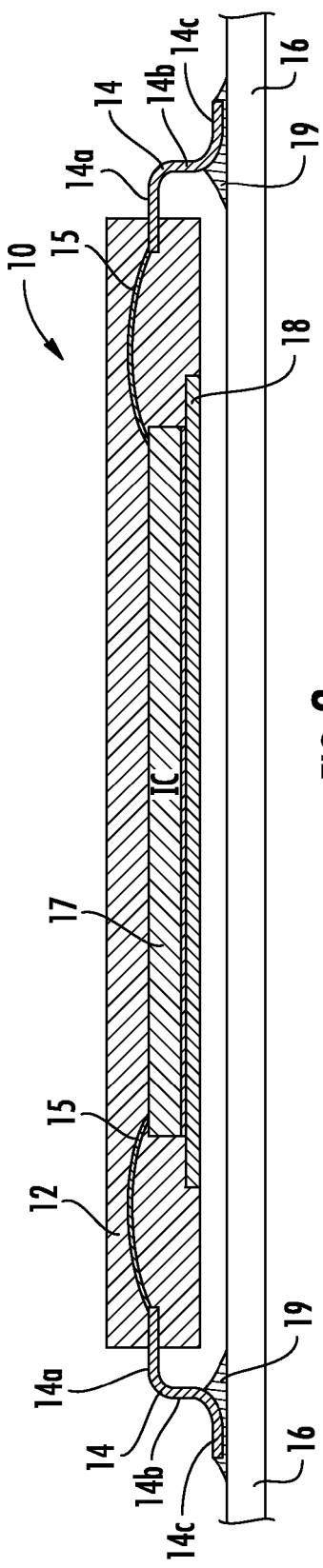
FIG. 2 is a sectional view of the prior art integrated circuit device of FIG. 1 showing an integrated circuit contained within the encapsulating material and leads coupled to the integrated circuit and extending outwardly from the side of the package.

FIG. 1 is a perspective view of a prior art integrated circuit device 10 formed as a surface mounted integrated circuit (IC) package, which in this illustrated example is a quad flat package that includes an encapsulating material 12 usually formed from a plastic material that surrounds an IC (not shown). A plurality of leads 14 are coupled to the encapsulated IC and extend outward from the four sides of the package as "gull wing" leads as best shown in the sectional view of FIG. 2 and soldered to a circuit board 16. FIG. 2 shows the leads 14 connected by wire bonds 15 to the encapsulated IC 17 supported on a die pad 18. The leads are soldered to the circuit board 16 using a respective solder joint 19.

The quad flat package shown in FIG. 1 includes eleven (11) pins or leads extending from each side of the package, which in this example is rectangular configured as a square body or package design. Commercial versions of quad flat packages range from packages having often 32 to over 300 leads with a pitch ranging from 0.4 to 1.0 mm. They are often manufactured and marketed as a low profile quad flat package (LQFP) or a thin quad flat package (TQFP).

The subject matter will be described relative to an example quad flat package. The integrated circuit device can be formed as a number of different device configurations, including quad flat packages or other surface mount integrated circuit packages known to those skilled in the art. The lead design shown in the prior art as in FIGS. 1 and 2 is a conventional "gull wing" type lead, but often has poor board level reliability when applied in automotive and similar designs because the conventional prior art design as shown in FIGS. 1 and 2 may not be sufficiently compliant to bending.

Figure 3:
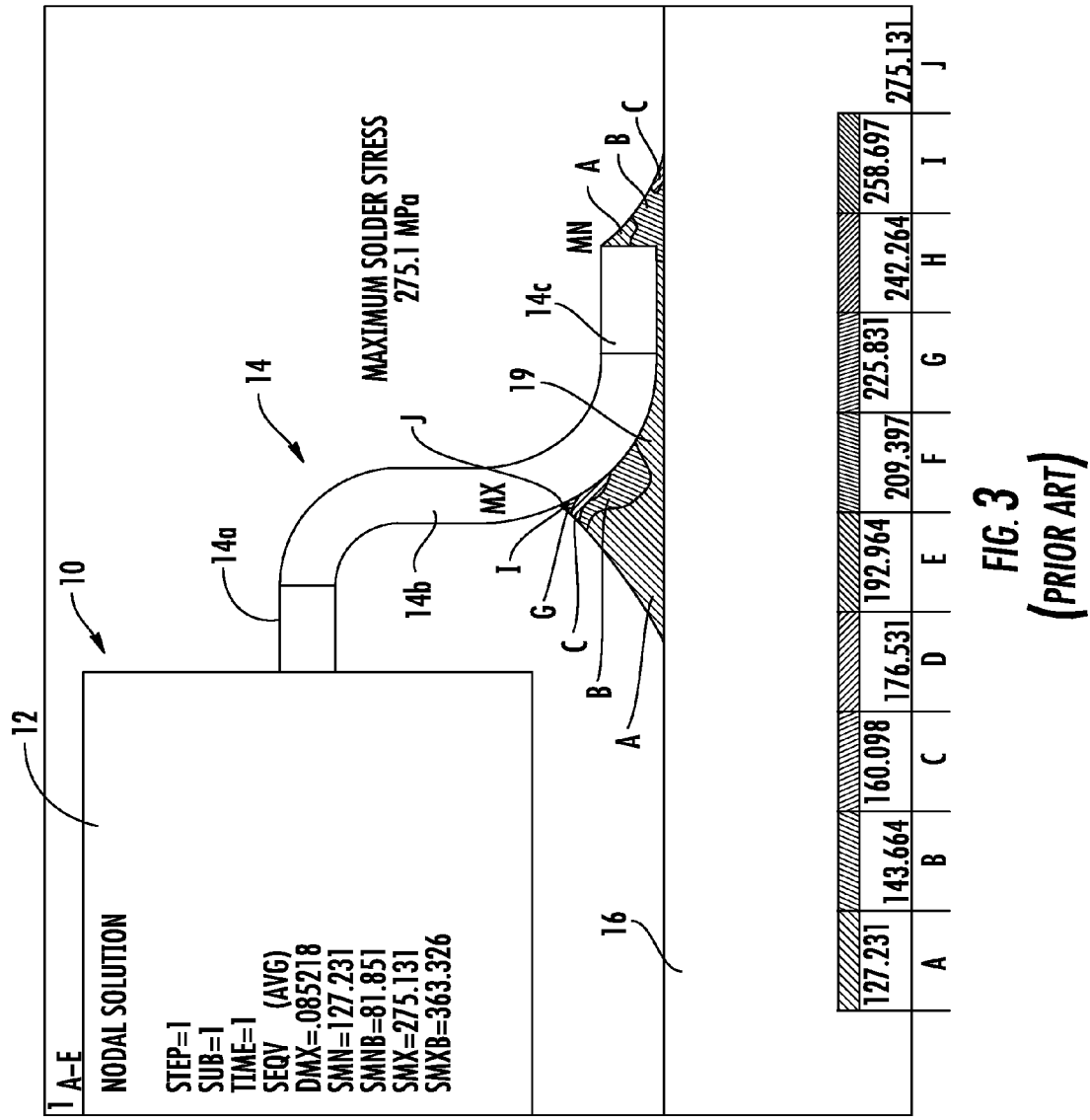
FIG. 3 is a fragmentary, partial sectional view of the prior art integrated circuit device and a soldered lead and showing the area of maximum solder stress.

FIG. 3 shows a computer aided engineering (CAE) simulation for a standard lead design of the prior quad flat package 10 as shown in FIGS. 1 and 2 where the conventional leads 14 do not relieve strain from the sides of the encapsulating material 12. Each lead has an upper horizontal segment 14a, a vertical segment 14b, and outwardly extending lower horizontal segment 14c that is soldered to the circuit board 16 via the solder joint 19. The leads 14 are configured to impart a conventional stand-off distance so that the bottom surface of the encapsulating material 12 stands off a distance from the circuit board 16 as illustrated. In this conventional prior art design, the maximum solder stress in this CAE simulation was 275.1 MPa. This prior art lead design shown in FIG. 3 is not sufficiently compliant to bending and may have poor board level reliability especially with quad flat packaging designs. Thus, this type of prior art package has degraded drop test and thermal cycling performance.

This FIG. 3 computer aided engineering simulation is similar to the drawings shown in FIGS. 5 and 6 for the Z-shape lead in accordance with a non-limiting example and as explained in detail below. In all three computer simulation drawings, the maximum solder stress point is referenced and the different solder stress figures in MPa are shown on the linear graph and are referenced to the solder joint. The computer simulation was established in each case using different nodal point and time parameters, which are indicated for the computer aided design and used to determine theoretical stress values for the illustrated solder joints. Each of FIGS. 3, 5 and 6 include a bar graph of stress values with corresponding indicia in letters that are referenced to the sections of the solder joint to correspond to the MPa stress values.

Figure 4:
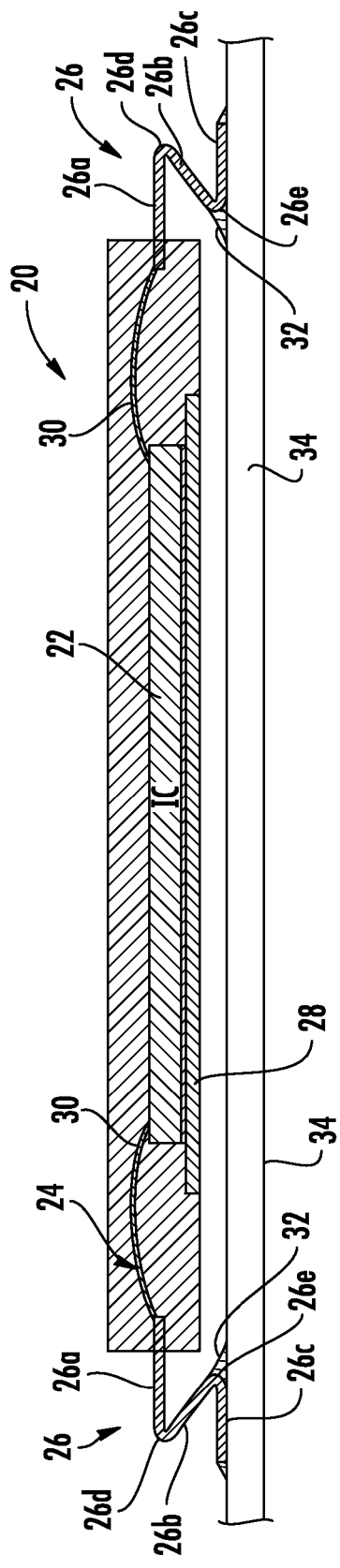
FIG. 4 is a sectional view of the integrated circuit device in accordance with a non-limiting example and showing a lead having the three contiguous exposed segments with upper and lower bends defining a Z-shape.

FIG. 4 is a fragmentary, partial sectional view of an integrated circuit (IC) device 20 in accordance with a non-limiting example and formed as a surface mounted integrated circuit package, for example, a quad flat package, and having an improved lead design where each lead defines a Z-shape. The device 20 includes an integrated circuit (IC) 22 and an encapsulating material 24 surrounding the IC 22. A plurality of leads 26 are coupled to the IC 22 and extend outward from the sides of the encapsulating material 24. At best shown in FIG. 5, each lead 26 has three contiguous exposed segments 26a, 26b, 26c and upper and lower bends 26d, 26e defining the Z-shape. In this illustrated example, a die pad 28 supports the IC 22 as is conventional in many packages. A respective wire bond 30 couples each lead 26 to the IC 22 as illustrated. Each lead 26 is soldered via solder joint 32 to the circuit board 34.

The encapsulating material 24 defines a bottom surface with each lead 26 extending downwardly so that a lower most surface formed by the lower exposed segment 26c is below the bottom surface of the encapsulating material 24. The three contiguous segments include an upper horizontal segment 26a, an intermediate inclined segment 26b, and the lower horizontal segment 26c. The lower horizontal segment 26c of each lead extends horizontally outwardly beyond the upper bend 26d in this example and the lower bend 26e of each lead is horizontally spaced outwardly from the encapsulating material to define a gap in the distance between the edge of the encapsulating material as defined by a vertical line extending to the circuit board and the lower bend 26e as illustrated. In one example, the inclined segment 26b of each lead is inclined at an angle of about a range of 40 to 50 degrees and in the illustrated example is about 45 degrees.

Figure 5:
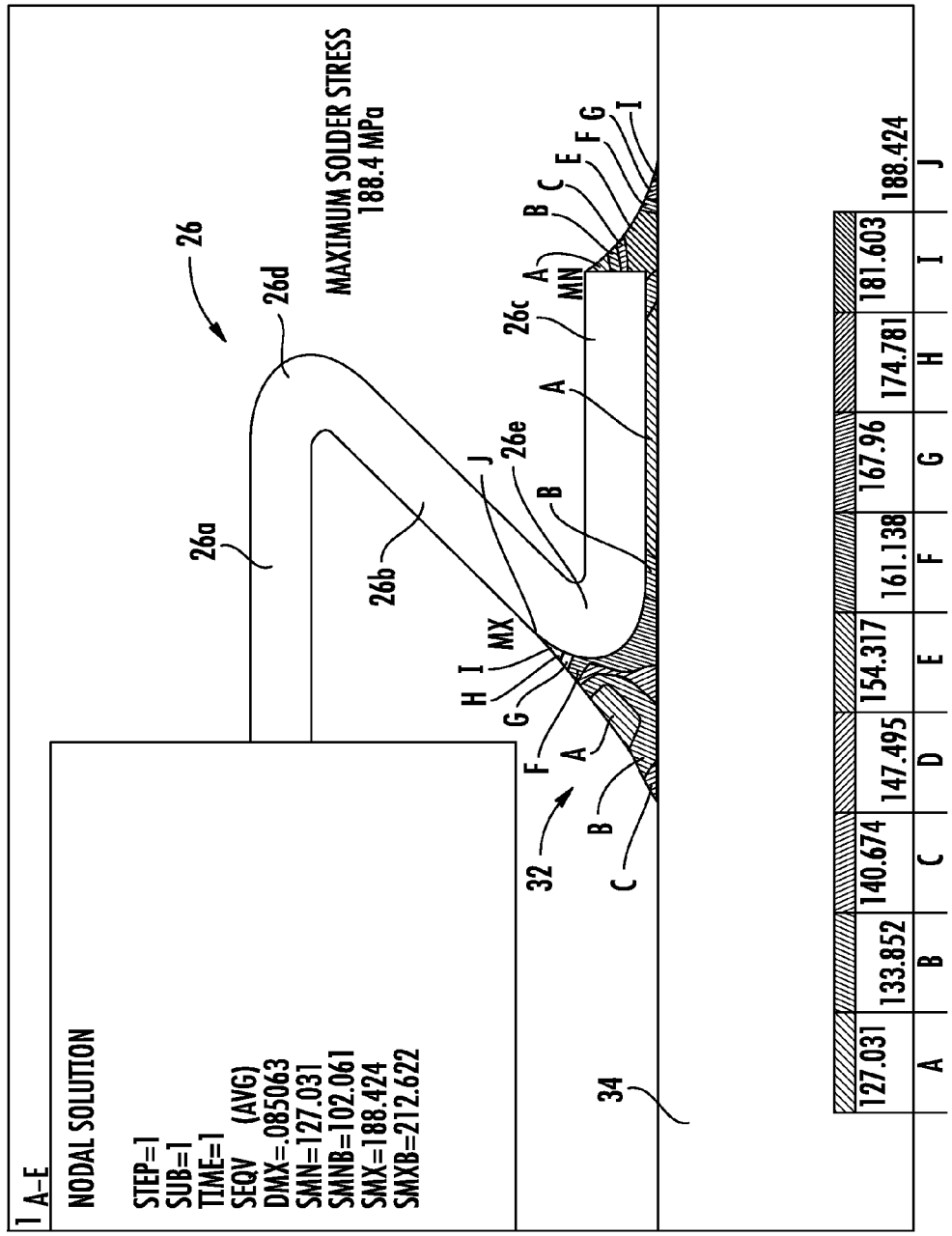
FIG. 5 is a fragmentary, partial sectional view of the integrated circuit device as in FIG. 4 and showing a first example of the Z-shape lead and an area of maximum solder stress.

FIG. 5 is a fragmentary, partial sectional view of the integrated circuit device 20 of FIG. 4 and showing a computer aided engineering simulation summary similar to that shown in FIG. 3 and showing that the maximum solder stress is about 188.4 MPa. Thus, the maximum stress at the solder joint 32 is reduced by over 30% as compared to the more conventional lead design as shown in FIG. 3 where the maximum solder stress is about 275.1 MPa. The Z-shape is more compliant to bending and improves the board level reliability. It absorbs the deformation mismatch between a package and board to enhance the solder joint reliability. The computer aided engineering simulation has some failure criterion assumptions with the maximum Von Mises stress at the solder joint junction with the lead 26. The reduced stress may also reduce the effective amount of solder that is needed to make a reliable joint. The different nodal solution parameters used in the computer simulation are shown.

Figure 6:
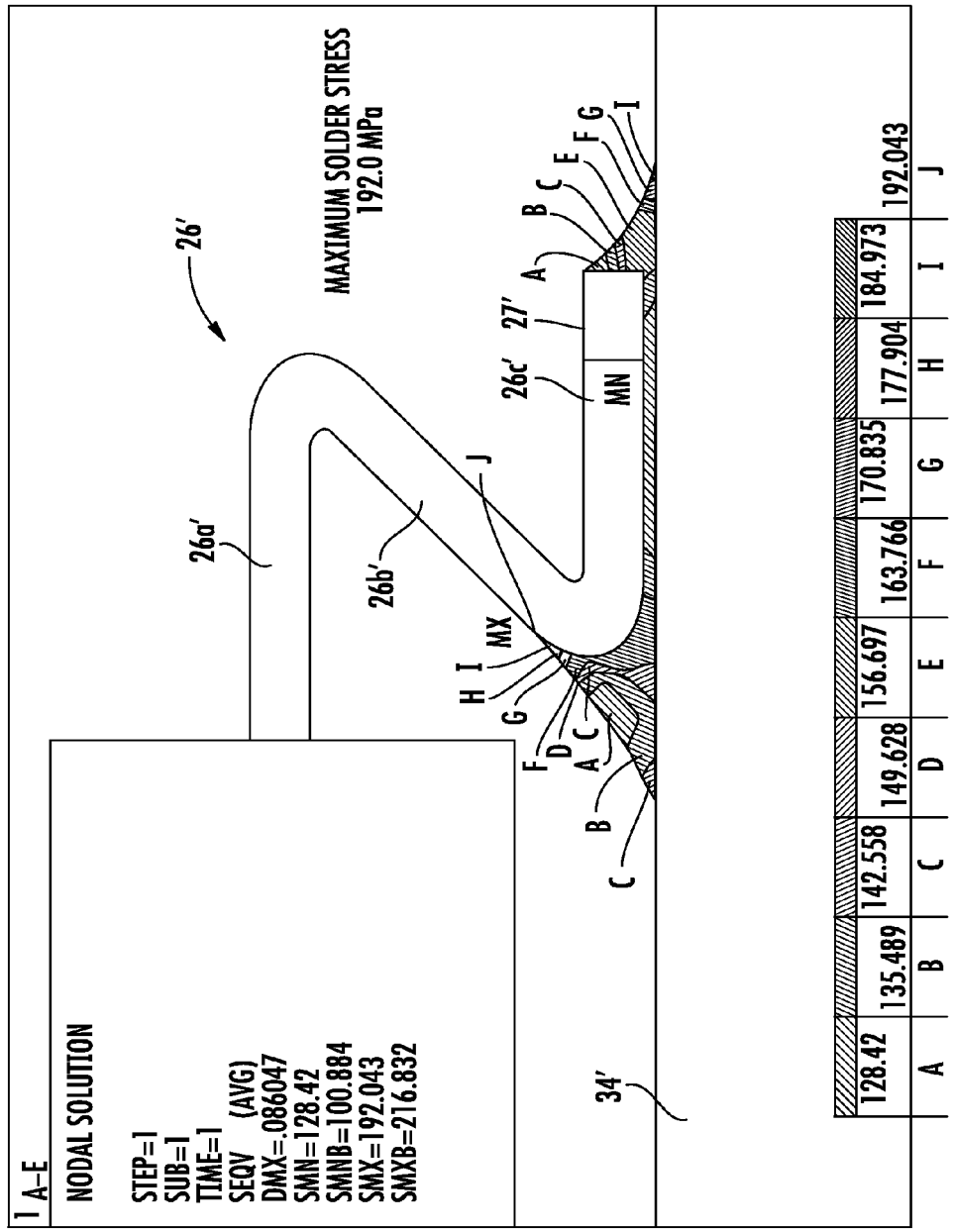
FIG. 6 is a fragmentary, partial sectional view similar to that shown in FIG. 5, but showing the lead with a slightly larger base area and the area of maximum solder stress.

FIG. 6 is another example of the Z-shape lead similar to that shown in FIG. 5, but showing a larger base area defined by the lower horizontal segment 26c' having a short extension 27' at the end. The Z-shaped lead has a maximum solder stress in this example of 192.0 MPA, indicating that the maximum stress at the solder is slightly increased by about 2% compared to the example shown in FIG. 5 with the shorter base area.

FIG. 7 is a fragmentary, partial sectional view of another embodiment of the integrated circuit (IC) device 40 and showing the integrated circuit (IC) 42 and the encapsulating material 44 surrounding the IC and a plurality of leads 46 (two illustrated) coupled to the IC 42 and extending horizontally outwardly from sides of the encapsulating material. As in the examples of FIGS. 5 and 6, a respective bond wire 48 couples each lead 46 to the IC 42 and the plurality of leads are arranged to define a quad flat package (QFP) in this example. As noted before, this IC device 40 can be formed as different types of surface mount integrated circuit packages. Each lead 46 is attached to the circuit board 50 via a solder joint 52.

In this example, the lead 46 length is longer than a normal lead, and exhibits a greater effective stand-off as compared to the prior art lead designs shown in FIGS. 1-3. The effective stand-off is higher for this lead 46, thus absorbing more thermal mismatch. Each lead has three contiguous exposed segments as an upper horizontal segment 46a, a lower horizontal segment 46b that is soldered to the circuit board, and an intermediate curved segment 46c extending upwardly from the upper horizontal segment and downwardly to the lower horizontal segment 46b. As in the examples of FIGS. 4-6, the encapsulating material 44 defines a bottom surface and each lead 46 extends downwardly so that a lower most surface thereof is below the bottom surface of the encapsulating material. In the example shown in FIG. 7, the lower horizontal segment 46b of each lead extends horizontally outwardly away from the encapsulating material.

FIG. 8 is a partial, sectional view of another embodiment similar to that shown in FIG. 7 and using prime notation, but where the intermediate curved segment 46c' is more rounded in an arcuate manner and the lower horizontal segment 46b' of each lead extends horizontally inward (instead of outward as in FIG. 7) toward the encapsulating material 44'. In both examples, the lower horizontal segment 46b' of each lead terminates in spaced relation from the encapsulating material as in the embodiment with the Z-shape.

A method of making an integrated circuit (IC) device includes surrounding an IC with an encapsulating material and coupling a plurality of leads to the ID. The leads are formed to extend outwardly from sides of the encapsulating material with each lead being formed to have three contiguous exposed segments with upper and lower bends defining a Z-shape. The method includes the encapsulating material being formed to define a bottom surface and forming each lead to extend downwardly so that a lowermost surface thereof is below the bottom surface of the encapsulating material. The three contiguous segments are also formed as an upper horizontal segment, an intermediate incline segment, and a lower horizontal segment. The lower horizontal segment of each lead is formed to extend horizontally outwardly beyond the upper bend. The lower bend of each lead is formed to be horizontally spaced outwardly from the encapsulating material. The intermediate incline segment of each lead is inclined at an angle in a range of 40-50 degrees. A respective bond wire is coupled from each lead to the IC. The plurality of leads are arranged to define a quad flat package (QFP).

In yet another embodiment, a method of making an integrated circuit (IC) device includes surrounding an IC with an encapsulating material. The method further includes coupling a plurality of leads to the IC and forming the leads to extend horizontally outwardly from sides of the encapsulating material with each lead having three contiguous exposed segments, including an upper horizontal segment, a lower horizontal segment, and an intermediate curved segment extending upwardly from the upper horizontal segment and downwardly to the lower horizontal segment.

The method further includes the encapsulating material formed to define a bottom surface and wherein each lead extends downwardly so that a lowermost surface thereof is below the bottom surface of the encapsulating material. The method includes forming the lower horizontal segment of each lead to extend horizontally inwardly towards the encapsulating material. The lower horizontal segment of each lead is formed to terminate in spaced relation from the encapsulating material. The lower horizontal segment of each lead is formed to extend horizontally outwardly away from the encapsulating material. The leads are arranged to define a quad flat package and a respective bond wire is coupling each lead to the IC.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An integrated circuit (IC) device comprising:
    an IC;
    an encapsulating material surrounding said IC;
    a plurality of leads coupled to said IC and extending outwardly from sides of said encapsulating material, each lead having three contiguous exposed segments with upper and lower bends defining a Z-shape, wherein the three contiguous exposed segments comprise:
    an upper horizontal segment;
    an intermediate inclined segment;
    a lower horizontal segment, and wherein the intermediate inclined segment of each lead is inclined at an angle in a range of 40 to 50 degrees; and
    said encapsulating material defines a top surface and a bottom surface, and each lead extends downwardly so that a lowermost surface thereof is below the bottom surface of said encapsulating material, and the distance between an upper surface of the upper horizontal segment and the top surface of the encapsulating material is greater than the distance between the lowermost surface of the lead and the bottom surface of the encapsulating material.

2. The IC device according to claim 1 wherein the lower horizontal segment of each lead extends horizontally outwardly beyond the upper bend.

3. The IC device according to claim 1 wherein the lower bend of each lead is horizontally spaced outwardly from said encapsulating material.

4. The IC device according to claim 1 further comprising a respective bond wire coupling each lead to said IC.

5. The IC device according to claim 1 wherein said plurality of leads are arranged to define a quad flat package (QFP).

6. A method of making an integrated circuit (IC) device comprising:
    surrounding an IC with an encapsulating material;
    coupling a plurality of leads to the IC;
    forming the leads to extend outwardly from sides of the encapsulating material, each lead being formed to have three contiguous exposed segments with upper and lower bends defining a Z-shape, wherein the three contiguous segments comprise:
    an upper horizontal segment;
    an intermediate inclined segment;
    a lower horizontal segment, and the intermediate inclined segment of each lead is inclined at an angle in a range of 40 to 50 degrees; and the encapsulating material defines a top surface and a bottom surface, and each lead extends downwardly so that a lowermost surface thereof is below the bottom surface of said encapsulating material, and the distance between an upper surface of the upper horizontal segment and the top surface of the encapsulating material is greater than the distance between the lowermost surface of the lead and the bottom surface of the encapsulating material.

7. The method according to claim 6 wherein the lower horizontal segment of each lead is formed to extend horizontally outwardly beyond the upper bend.

8. The method according to claim 6 wherein the lower bend of each lead is formed to be horizontally spaced outwardly from the encapsulating material.

9. The method according to claim 6 wherein a respective bond wire is coupled from each lead to the IC.

10. The method according to claim 6 wherein the plurality of leads are arranged to define a quad flat package (QFP).

\* \* \* \* \*